(12) United States Patent
Mawhinney et al.

(10) Patent No.: US 9,072,183 B2
(45) Date of Patent: Jun. 30, 2015

(54) ELECTROMAGNETIC COMPATIBILITY PRINTED CIRCUIT BOARD

(75) Inventors: Nicholas Lee Mawhinney, Fenton, MI (US); Andrew Malcolm Haig, Birmingham, MI (US); Michael Zaitz, Royal Oak, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 746 days.

(21) Appl. No.: 13/328,048

(22) Filed: Dec. 16, 2011

(65) Prior Publication Data

US 2013/0154411 A1 Jun. 20, 2013

(51) Int. Cl.
| | |
|---|---|
| H02K 11/02 | (2006.01) |
| H05K 7/06 | (2006.01) |
| H02K 5/14 | (2006.01) |
| H05K 9/00 | (2006.01) |
| H05K 1/02 | (2006.01) |
| H02K 5/22 | (2006.01) |

(52) U.S. Cl.
CPC .................. *H05K 7/06* (2013.01); *H02K 5/145* (2013.01); *H02K 5/225* (2013.01); *H02K 11/026* (2013.01); *H05K 9/00* (2013.01); *H02K 2211/03* (2013.01); *H05K 1/0231* (2013.01); *H05K 2201/1009* (2013.01)

(58) Field of Classification Search
CPC ..... H04B 15/02; H02K 57/006; H02K 17/08; H02K 17/30
USPC ......... 310/68 R, 68 B, 72; 174/350; 361/760, 361/782
See application file for complete search history.

(56) References Cited

U.S. PATENT DOCUMENTS

| | | | | |
|---|---|---|---|---|
| 3,924,147 | A * | 12/1975 | Tarnow et al. | 310/68 R |
| 4,329,605 | A * | 5/1982 | Angi et al. | 310/68 R |
| 4,661,733 | A * | 4/1987 | Heyraud | 310/68 R |
| 4,935,653 | A * | 6/1990 | Cheng | 310/72 |
| 5,770,902 | A * | 6/1998 | Batten et al. | 310/71 |
| 5,943,214 | A * | 8/1999 | Sato et al. | 361/752 |
| 6,078,117 | A * | 6/2000 | Perrin et al. | 310/68 R |
| 6,717,301 | B2 * | 4/2004 | DeDaran et al. | 310/68 R |
| 6,812,605 | B2 * | 11/2004 | Tyshchuk et al. | 310/68 R |
| 7,019,425 | B2 * | 3/2006 | Langguth et al. | 310/68 R |
| 7,579,728 | B2 * | 8/2009 | Guttenberger | 310/71 |
| 2002/0097061 | A1 * | 7/2002 | He et al. | 324/762 |
| 2009/0244877 | A1 * | 10/2009 | Yeh et al. | 361/818 |

* cited by examiner

*Primary Examiner* — Naishadh Desai

(57) ABSTRACT

An electromagnetic compatibility (EMC) shielding printed circuit board (PCB) has at least a routing layer and a ground layer. The shielding PCB has an opening that receives a motor bushing and at least one opening that receives motor terminals.

18 Claims, 7 Drawing Sheets

ELECTROMAGNETIC COMPATIBILITY PRINTED CIRCUIT BOARD

TECHNICAL FIELD

The present disclosure relates generally to electric motor construction, and particularly to an electromagnetic compatibility (EMC) component for a motor.

BACKGROUND OF THE INVENTION

It is understood in motor design that electric power received by a motor is affected by electromagnetic compatibility noise (EMC noise). The amount of EMC noise and its affects depend on the motor design as well as what components are connected to the motor. The impact that the EMC noise has on a power signal received by the motor can be negated or reduced by the inclusion of noise filtering electronics (EMC components) connected to the input terminals of the motor.

Current EMC noise reduction systems require individually hand soldering noise filtering electronics such as capacitors and inductors to the motor housing and/or motor end cap in order to allow a particular motor to meet the requirements of a particular application. These filtering components are known as EMC components. The EMC components are connected to the motor housing and/or motor end cap, which also holds the bushing. The EMC components filter EMC noise from the power received by the motor as well as the EMC noise produced by the motor. Attaching each of the filter components by hand is a labor intensive process that entails significant costs. Placement of the EMC components results in a complex endcap design that can often only be used for a single application.

SUMMARY OF THE INVENTION

Disclosed is an electromagnetic compatibility (EMC) shielding printed circuit board (PCB), which has at least a routing layer and a ground layer. Additional PCB layers can also be used. The shielding PCB also has an opening that receives a motor bushing and at least one opening that receives motor terminals.

Also disclosed is an electric motor having a metal housing, a bushing extending from the metal housing, a shielding printed circuit board (PCB) with a first routing layer and a second grounding layer. The shielding PCB has a bushing opening extending through the first routing layer and the second grounding layer and at least one terminal opening extending through the first routing layer and the second grounding layer. Additional layers can also be used to provide further grounding and signal routing, as well as for rigidity. A plurality of electromagnetic compatibility (EMC) devices are mounted to the routing layer. The bushing is received in the bushing opening, and at least one motor terminal is received in the at least one terminal opening. Each of the EMC devices is electrically connected to at least one motor terminal.

These and other features of the present invention can be best understood from the following specification and drawings, the following of which is a brief description.

DETAILED DESCRIPTION

Figure 1:
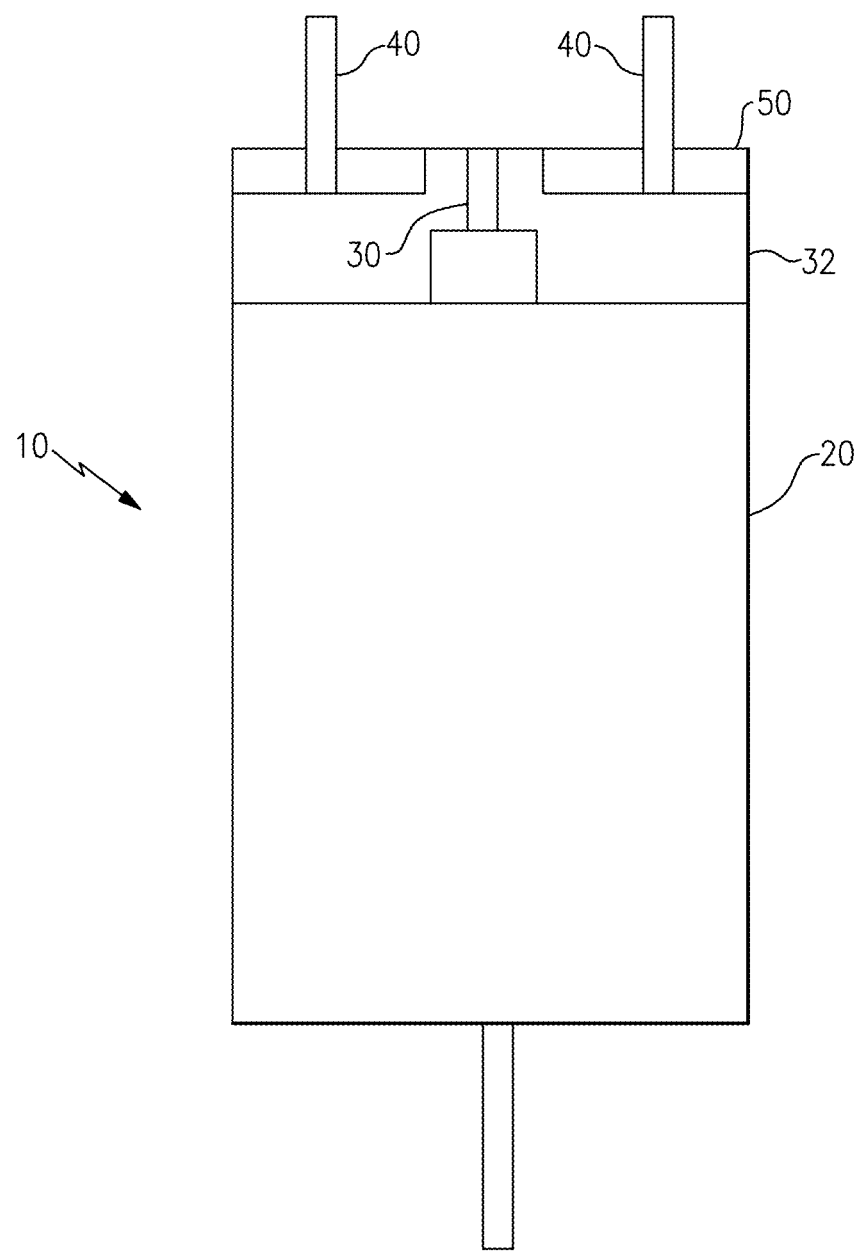
FIG. 1 schematically illustrates an electric motor.

FIG. 1 illustrates an electric motor 10. The electric motor 10 has a motor bushing 30 protruding away from a motor body 20. A connection terminal 40 extends out from the motor 10 and allows the motor 10 to receive electric power. The motor bushing 30 is encompassed by a plastic endcap 32 that protects the motor bushing 30 and holds the motor bushing 30 in place. An electromagnetic compatibility (EMC) shielding printed circuit board (PCB) 50 is mounted about the plastic endcap 32 surrounding the motor bushing 30 and about multiple motor terminals 40. The EMC shielding PCB 50 provides EMC shielding and EMC noise filtering components for the motor 10.

Figure 2A:
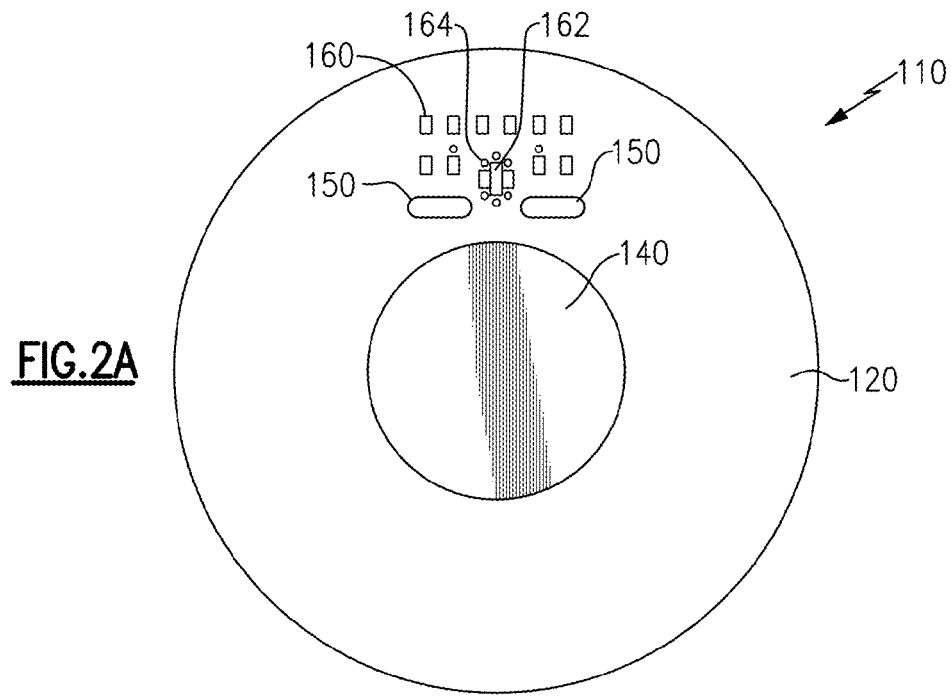
FIG. 2A schematically illustrates a bottom view of a motor terminal shielding component for an electric motor.
Figure 2B:
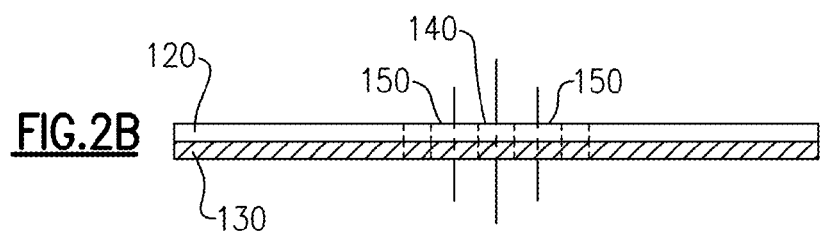
FIG. 2B schematically illustrates a side view of a motor terminal shielding component for an electric motor.
Figure 2C:
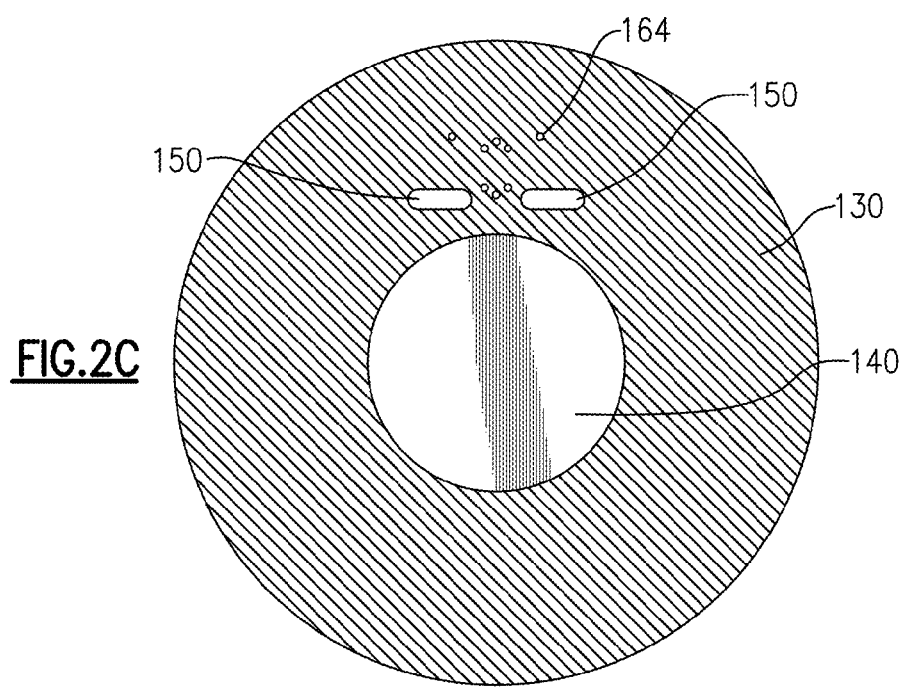
FIG. 2C schematically illustrates a top view of a motor terminal shielding component for an electric motor.
Figure 3A:
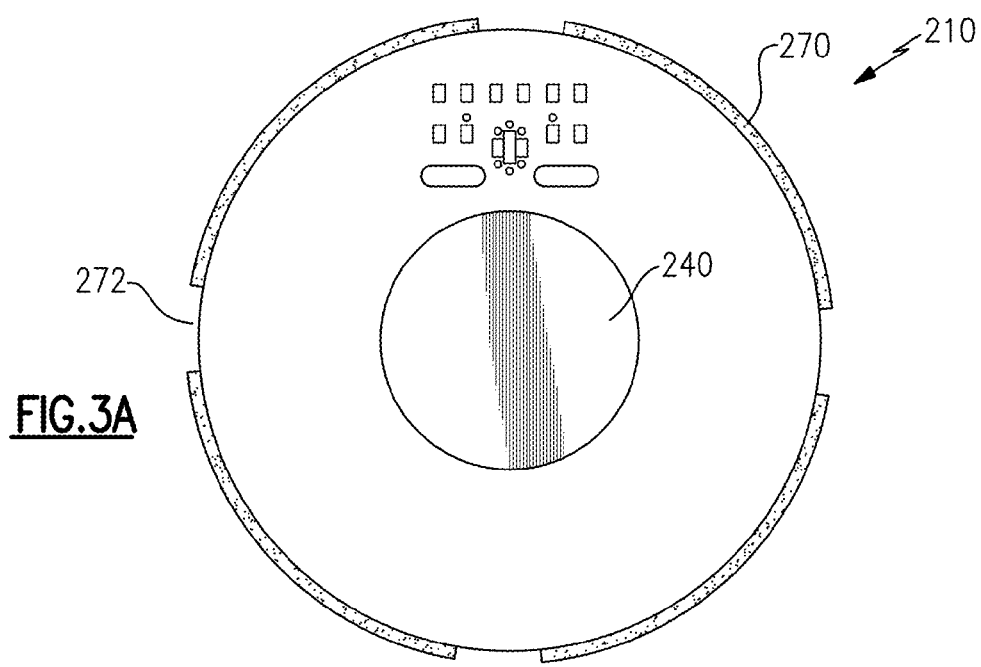
FIG. 3A schematically illustrates a bottom view of a second motor terminal shielding for an electric motor.
Figure 3B:
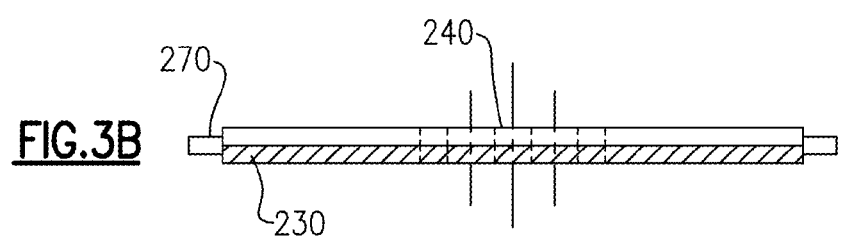
FIG. 3B schematically illustrates a side view of a second motor terminal shielding for an electric motor.
Figure 3C:
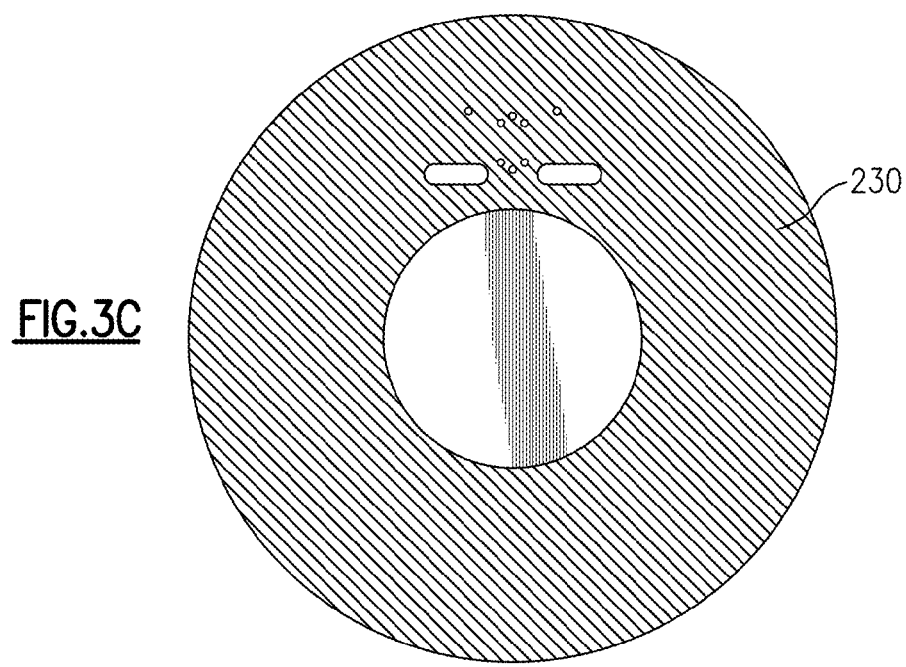
FIG. 3C schematically illustrates a top view of a second motor terminal shielding for an electric motor.
Figure 3D:
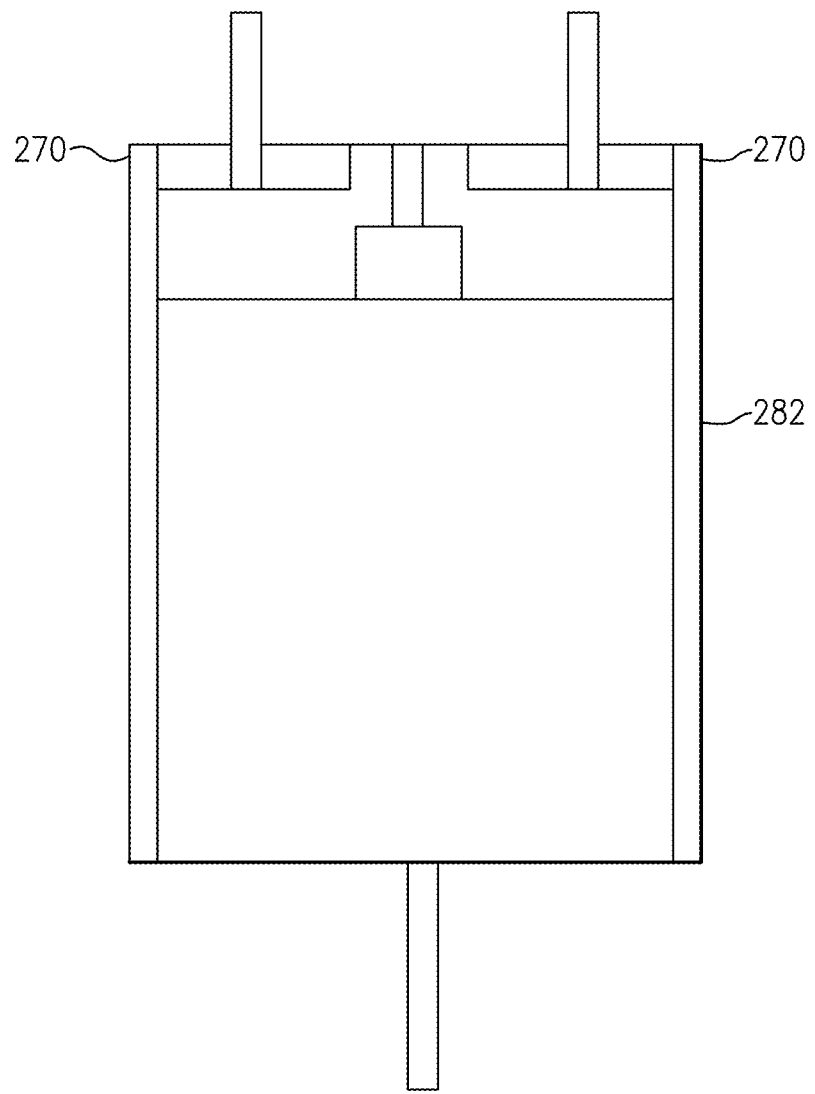
FIG. 3D schematically illustrates the motor terminal shielding of FIGS. 3A-3C on an electric motor.
Figure 4A:
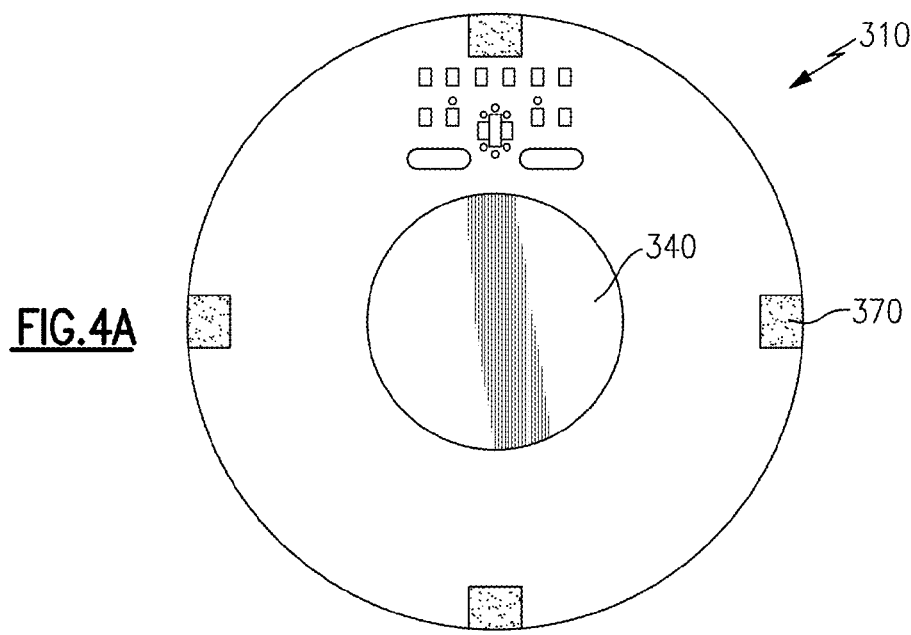
FIG. 4A schematically illustrates a bottom view of a third motor terminal shielding for an electric motor.
Figure 4B:
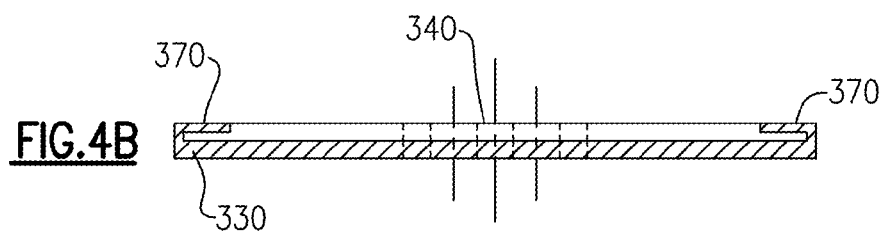
FIG. 4B schematically illustrates a side view of a third motor terminal shielding for an electric motor.
Figure 4C:
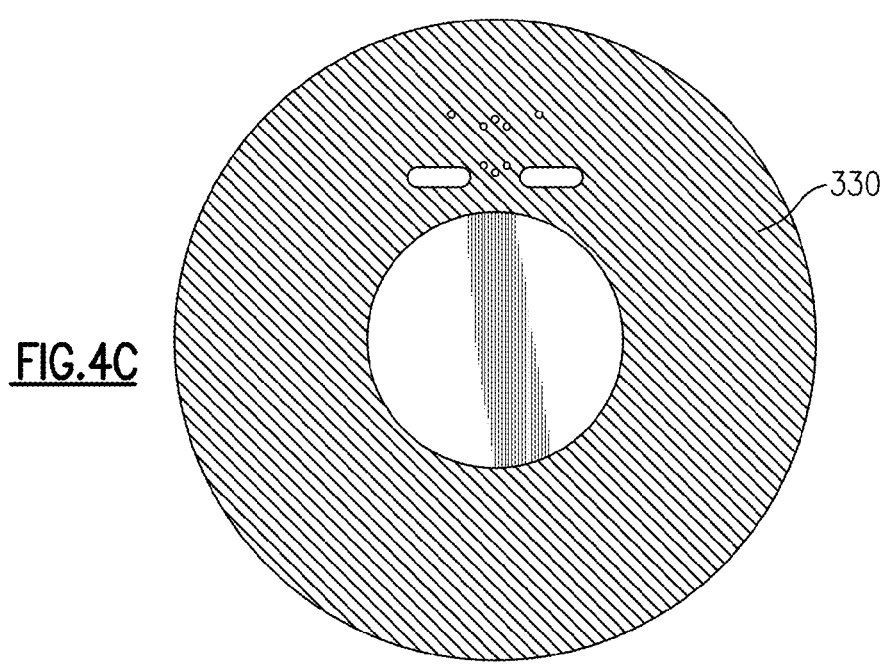
FIG. 4C schematically illustrates a top view of a third motor terminal shielding for an electric motor.
Figure 4D:
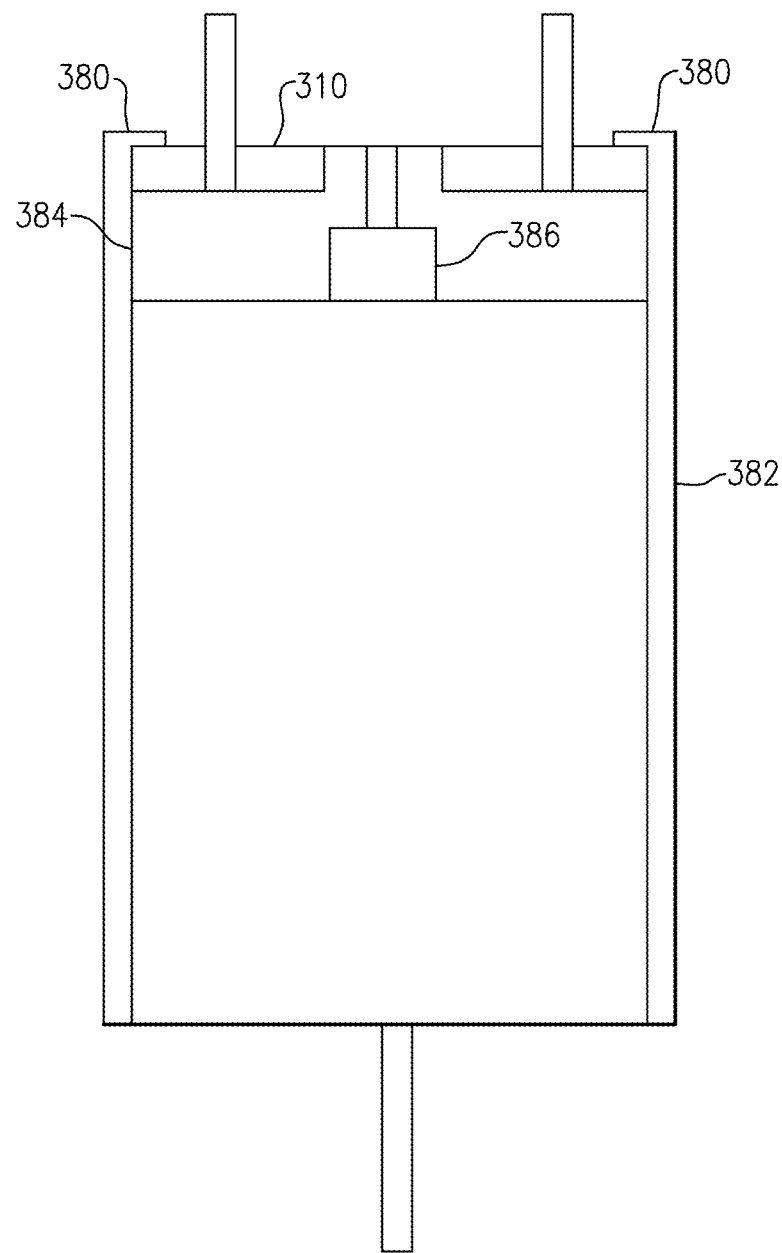
FIG. 4D schematically illustrates the motor terminal shielding of FIGS. 4A-4C on an electric motor.

FIGS. 2A-C illustrate a top (FIG. 2C) side (FIG. 2B) and bottom (FIG. 2A) view of an EMC shielding printed circuit board (PCB) 110. The shielding PCB 110 includes at least a routing layer 120 and a grounding layer 130. Additional layers can also be used. A motor bushing opening 140 is in the center of the shielding PCB 110 and allows for a motor bushing and/or a motor bushing end cap to protrude through the shielding PCB 110 when the shielding PCB 110 is mounted on a motor. Two terminal slots 150 protrude through both layers 120, 130 of the shielding PCB 110 and allow for motor terminal connections to pass through the shielding PCB 110. The routing layer 120 includes surface mounts 160 and a capacitor mount 162 for mounting EMC components to the shielding PCB 110. Ground holes 164 passing through the shielding PCB 110 allow EMC components mounted to the surface mounts 160 and the capacitor mounts 162 to include a connection to the ground layer 130. The terminal slots 150 are plated and electrically connected to the routing layer 120 in order to electrically connect to the surface mount components 160 and 162 to the motor terminals.

When EMC components are mounted to the surface mounts 160, and the capacitor mount 162, the EMC components are connected to one or both of the motor terminals passing through the motor terminal slots 150 via printed circuit connections on the routing layer 120 of the shielding PCB 110. The EMC components can be standard varistors, transorbs, capacitors, or inductors, all of which are known. Alternately, any other EMC component capable of being mounted on a printed circuit board could also be used, as necessary.

In the example of FIGS. 2A-C, a capacitor is mounted to the capacitor mount 162, and EMC component types with standard mounts are mounted to the surface mounts 160. The example of FIGS. 2A-C illustrate five standard surface mounts 160 and one capacitor mount 162, however, it is understood that additional EMC components can be mounted on the routing layer 120 as needed by a particular motor application via the inclusion of additional surface mounts 160 and capacitor mounts 162.

The shielding PCB 110 is mounted to a motor with the grounding layer 130 facing away from the motor, and the routing layer 120 facing towards the motor. The shielding PCB 110 is attached to the motor using either preexisting endcap tabs or crimping the shielding PCB 110 to the motor housing as described below with reference to FIGS. 3A-D and 4A-D. An electric connection exists between the grounding layer 130 and the motor housing. This connection effectively houses the EMC components within a grounded metal housing, thereby creating EMC noise shielding, with all of the EMC components contained within the shielding. The EMC shielding prevents EMC noise produced by the motor from being radiated outside of the motor housing.

FIGS. 3A-D illustrate a top (FIG. 3A), side (FIG. 3B), bottom (FIG. 3C), and schematic (FIG. 3D) view of an EMC shielding PCB 210 that attaches to a motor housing 282 by crimping the shielding PCB 210 to the motor housing 282. The shielding PCB 210 illustrated in FIG. 3 is identical to the shielding PCB 110 illustrated in FIG. 1 with the addition of a plated crimping ring 270 about the circumference of the shielding PCB 210. The plated crimping ring 270 includes multiple gap portions 272, each of which allows the crimping ring 270 to be crimped to the motor housing 282. The crimping ring 270 can be an additional ring attached to the shielding PCB 210 as in the illustrated embodiment, or a plated portion of the shielding PCB 210 that is crimpable. In either case, the crimping ring 270 is electrically conductive and electrically connects the grounding layer 230 to the motor housing 282.

FIGS. 4A-D illustrate a top (FIG. 4A), side (FIG. 4B), bottom (FIG. 4C), and schematic (FIG. 4D) view of an EMC shielding PCB 310, that attaches to a motor housing 382 using metal connecting tabs 380 on the motor housing 382. The example motor housing 382 includes metal connecting tabs 380 for holding a plastic endcap 384 for the motor bushing 386 in place. The shielding PCB 310 includes four routing layer tab connection pads 370. Alternatively another number of tab connection pads 370 can be included depending on the particular motor design. The metal connecting tabs 380 apply force against the routing layer connection pads 370, thereby holding the shielding PCB 310 in place. The routing layer connection pads 370 are a conductive material that wraps around from a routing layer 320 to a ground layer 330 such that the ground layer 330 is electrically connected to the motor housing 382 via the metal connecting tabs 380 when the shielding PCB 310 is mounted to the motor.

In both the example of FIG. 3A-D and the example of FIG. 4A-D, the mechanical mechanism for attaching the shielding PCB 210, 310 to the motor housing also serves to electrically connect the ground layer 230, 330 to the motor housing, thereby encompassing the EMC filter components within an EMC shielding, and further minimizing EMC noise produced by the motor.

It is further understood that either of the attachment methods illustrated above with regards to FIGS. 3A-D and 4A-D can be used independently to hold the shielding PCB 110, 210, 310 to the motor housing, or can be used in conjunction with each other to ensure a more solid connection.

Figure 5A:
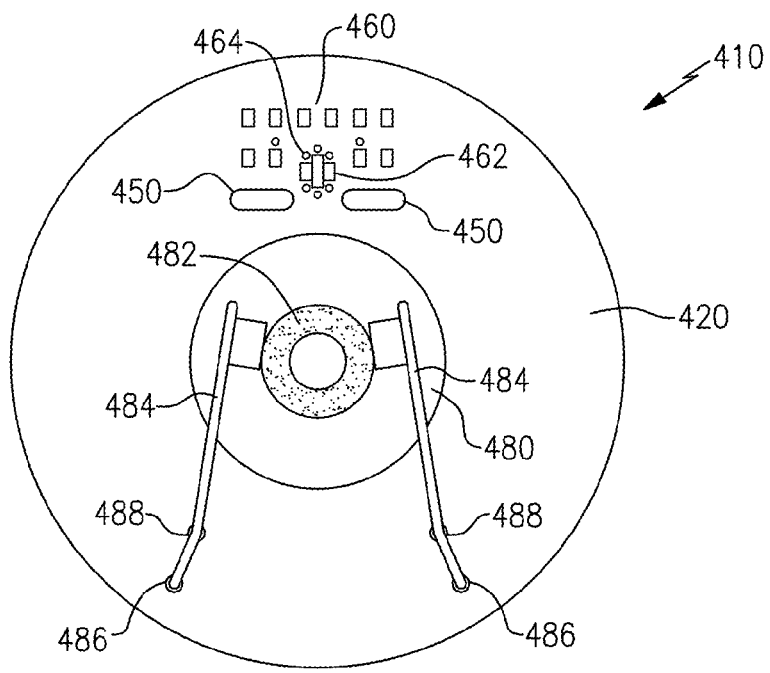
FIG. 5A schematically illustrates a bottom view of a fourth motor terminal shielding for an electric motor.
Figure 5B:
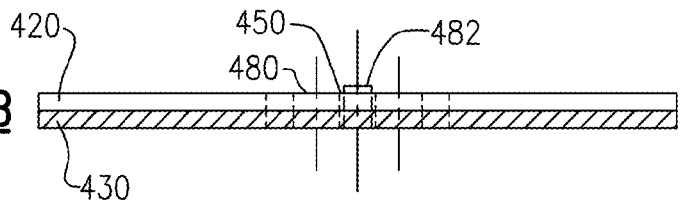
FIG. 5B schematically illustrates a side view of a fourth motor terminal shielding for an electric motor.
Figure 5C:
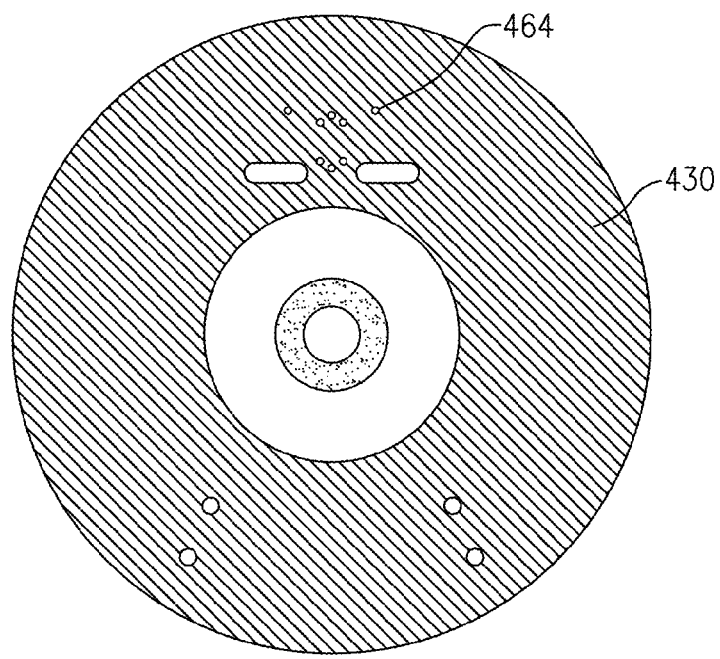
FIG. 5C schematically illustrates a top view of a fourth motor terminal shielding for an electric motor.

FIGS. 5A-C illustrate a top (FIG. 5A), side (FIG. 5B), and bottom (FIG. 5C) view of an alternate example EMC shielding PCB 410 where a shielding PCB 410 replaces an endcap covering a motor bushing. As with the previously described examples, the shielding PCB 410 includes a routing layer 420 and a grounding layer 430, as well as multiple surface component mounts 460, a capacitor mount 462, multiple terminal slots 450, and ground holes 464 for connecting mounted EMC components to the grounding layer 430.

Where the examples of FIGS. 2A-C, 3A-D, and 4A-D included a gap (referred to as a motor bushing opening 140, 240, 340) for receiving a motor bushing endcap, the illustrated shielding PCB 410 of FIGS. 5A-C includes a plastic insert 480. The plastic insert 480 receives a motor bushing 482 and maintains the position of the motor bushing 482. In this arrangement, the plastic endcap 32 covering the motor bushing 30 in the example of FIG. 1 is omitted. The motor bushing 482 is further held in place by multiple bushing brushes 484 that are affixed to the shielding PCB 410. The bushing brushes 484 are affixed to the shielding PCB 410 via a connection point 486, and held tight against the motor bushing 482 via a tension point 488. The combination of the bushing brushes 484 and the plastic insert 480 holding the motor bushing 482 in place renders the plastic endcap unnecessary, thereby reducing weight and cost of the motor. The example shielding PCB 410 illustrated in FIG. 5 can be attached to the motor via either of the attachment methods described above with regards to FIGS. 3A-D and 4A-D.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electromagnetic compatibility (EMC) component mounting device comprising:
    a shielding printed circuit board (PCB) having at least a first routing layer and a second grounding layer, wherein said first routing layer further comprises a plurality of EMC component mounts, the shielding printed circuit board further comprising one of an outer crimpable circumference plated with an electrical conductor such that said grounding layer is electrically connected to a motor housing when said shielding PCB is installed and a plurality of electrically conductive connection pads disposed on said routing layer, and said pads are operable to electrically connect the grounding layer to a motor housing when said shielding PCB is installed;
    a bushing opening defined by the shielding PCB that is operable to receive a motor bushing; and
    at least one terminal opening defined by the shielding PCB that is operable to receive motor connection terminals.

2. The EMC component mounting device of claim 1, wherein said at least one terminal opening is a plated slot operable to receive a motor terminal without connecting said motor terminal to said grounding layer.

3. The EMC component mounting device of claim 1, wherein said shielding PCB further comprises a plurality of EMC filter components mounted to said plurality of EMC component mounts.

4. The EMC component mounting device of claim 3, wherein each of said EMC filter components is electrically connected to at least one terminal opening such that each of said EMC filter components is connected to a motor terminal when a motor terminal is received in said terminal opening.

5. The EMC component mounting device of claim 3, wherein at least one of said EMC filter components comprises at least one of a X2Y filter, a varistor, transorb, an inductor, and a capacitor.

6. An electromagnetic compatibility (EMC) component mounting device comprising:
   a shielding printed circuit board (PCB) having at least a first routing layer and a second grounding layer, wherein said first routing layer further comprises a plurality of EMC component mounts;
   a bushing opening defined by the shielding PCB that is operable to receive a motor bushing;
   at least one terminal opening defined by the shielding PCB that is operable to receive motor connection terminals; and
   wherein said shielding PCB has a plated outer crimpable circumference and said outer circumference is plated with an electrical conductor such that said grounding layer is electrically connected to a motor housing when said motor terminal shielding is installed.

7. The EMC component mounting device of claim 6, wherein said plated crimpable outer circumference comprises a plurality of gaps operable to allow said plated crimpable outer circumference to be crimped to a motor housing.

8. The EMC component mounting device of claim 1, wherein said routing layer of said shielding PCB includes at least one connection pad operable to connect an engine housing tab to said grounding layer.

9. The EMC component mounting device of claim 1, further comprising a plastic insert inserted into said bushing opening, said plastic insert being operable to maintain a motor bushing alignment.

10. The EMC component mounting device of claim 9, wherein said shielding PCB further comprises a plurality of bushing brushes operable to contact a motor bushing.

11. The EMC component of claim 10, wherein said bushing brushes are connected to said shielding PCB via a connection point and maintained in contact with said motor bushing via a tension point.

12. An electric motor comprising:
   a metal housing;
   a bushing extending from said metal housing;
   a shielding printed circuit board (PCB) having a first routing layer and a second grounding layer;
   said shielding PCB further comprising a bushing opening extending through said first routing layer and said second grounding layer and one of an outer crimpable circumference plated with an electrical conductor such that said grounding layer is electrically connected to a motor housing when said shielding PCB is installed and a plurality of electrically conductive connection pads disposed on said routing layer, and said pads are operable to electrically connect the grounding layer to a motor housing when said shielding PCB is installed;
   at least one terminal opening extending through said first routing layer and said second grounding layer, and a plurality of electromagnetic compatibility (EMC) devices mounted to said routing layer;
   wherein said bushing is received in said bushing opening, and at least one motor terminal is received in said at least one terminal opening; and
   wherein each of said EMC devices is electrically connected to at least one motor terminal.

13. The electric motor of claim 12, wherein said connection feature comprises a crimping ring on an exterior circumference of said shielding PCB and wherein said shielding PCB is crimped to said metal housing via said crimping ring.

14. The electric motor of claim 13, wherein said crimping ring comprises at least one gap portion operable to allow said crimping ring to be crimped.

15. The electric motor of claim 12, wherein said shielding PCB further comprises at least one tab connection pad and said shielding PCB is attached to said motor housing via at least one metal tab contacting said tab connection pad.

16. The electric motor of claim 15, wherein said tab connection pad electrically connects said second grounding layer to said motor housing via said metal tab, thereby creating an EMC device shielding.

17. The electric motor of claim 12, wherein said shielding PCB is attached to said motor with said first routing layer facing said motor housing and said second grounding layer facing away from said motor housing.

18. The electric motor of claim 12, wherein said shielding PCB comprises a plastic insert operable to receive a motor bushing, and a plurality of motor bushing brushes, and wherein each of said motor bushing brushes is mounted to said shielding PCB routing layer via at least a connection point and a tension point.

* * * * *